United States Patent
Tong et al.

(10) Patent No.: US 7,037,399 B2
(45) Date of Patent: *May 2, 2006

(54) UNDERFILL ENCAPSULANT FOR WAFER PACKAGING AND METHOD FOR ITS APPLICATION

(75) Inventors: Quinn K. Tong, Belle Mead, NJ (US); Yue Xiao, Belle Mead, NJ (US); Bodan Ma, Racine, WI (US); Sun Hee Hong, Hillsborough, NJ (US)

(73) Assignee: National Starch and Chemical Investment Holding Corporation, New Castle, DE (US)

(*) Notice: Subject to any disclaimer, the term of this patent is extended or adjusted under 35 U.S.C. 154(b) by 0 days.

This patent is subject to a terminal disclaimer.

(21) Appl. No.: 10/084,869

(22) Filed: Mar. 1, 2002

(65) Prior Publication Data

US 2003/0171456 A1 Sep. 11, 2003

(51) Int. Cl.
*B32B 31/12* (2006.01)

(52) U.S. Cl. .................. 156/256; 156/330; 257/793; 428/620; 523/466; 528/94; 528/103; 528/405; 528/407; 528/418; 528/419

(58) Field of Classification Search ................ 257/793; 428/620; 438/113, 114, 118, 127; 523/466; 528/94, 103, 103.5, 405, 407, 418, 419; 156/256, 156/330

See application file for complete search history.

(56) References Cited

U.S. PATENT DOCUMENTS

| | | | |
|---|---|---|---|
| 5,855,821 A | 1/1999 | Chau et al. | |
| 6,121,689 A | 9/2000 | Capote et al. | |
| 6,132,646 A | 10/2000 | Zhou et al. | |
| 6,180,696 B1 | 1/2001 | Wong et al. | |
| 6,194,788 B1 | 2/2001 | Gilleo et al. | |
| 6,265,776 B1 * | 7/2001 | Gilleo ...................... | 257/738 |
| 6,458,472 B1 * | 10/2002 | Konarski et al. ........... | 428/620 |
| 6,746,896 B1 * | 6/2004 | Shi et al. .................. | 438/108 |
| 6,833,629 B1 * | 12/2004 | Ma et al. ................... | 257/790 |
| 2001/0034382 A1 | 10/2001 | Sumita et al. | |
| 2003/0162911 A1 | 8/2003 | Xiao et al. | |
| 2003/0164555 A1 * | 9/2003 | Tong et al. ................. | 257/787 |

FOREIGN PATENT DOCUMENTS

| | | |
|---|---|---|
| EP | 1114845 | 7/2001 |
| JP | 58103525 | 6/1983 |
| JP | 62-081416 A | 4/1987 |
| JP | 10-101906 A | 4/1989 |
| JP | 04248827 | 9/1992 |
| JP | 07224153 | 8/1995 |
| JP | 2001107008 | 4/2001 |
| WO | WO 97/07541 | 2/1997 |
| WO | WO 98/37134 | 8/1998 |
| WO | WO 02/070191 | 9/2002 |

OTHER PUBLICATIONS

Yala, Nadia et al.: "Characterization of Flip Chip Assembly Utilizing Wafer Applied Underfill"; 2002 Electronic Components and Technology Conference (2002).
Charles, Scott et al.: "Pre-Applied Underfill Adhesives for Flip Chip Attachment"; 2001 International Symposium on Microelectronics; pp. 178–183.

* cited by examiner

*Primary Examiner*—David Buttner
(74) *Attorney, Agent, or Firm*—Charles W. Almer

(57) ABSTRACT

A curable underfill encapsulant composition that is applied directly onto semiconductor wafers before the wafers are diced into individual chips. The composition comprises a thermally curable epoxy resin, a solvent, an imidazole-anhydride curing agent, fluxing agents, and optionally, wetting agents. Various other additives, such as defoaming agents, adhesion promoters, flow additives and rheology modifiers may also be added as desired. The underfill encapsulant is B-stageable to provide a coating on the wafer that is smooth, non-tacky and will allow the wafer to be cleanly diced into individual chips. A method for producing an electronic package containing the B-stageable material may also utilize an unfilled liquid curable fluxing material on the substrate to which the chip is to be attached.

24 Claims, No Drawings

UNDERFILL ENCAPSULANT FOR WAFER PACKAGING AND METHOD FOR ITS APPLICATION

FIELD OF THE INVENTION

The present invention is related to an underfill encapsulant and a method for its application to semiconductor wafers.

BACKGROUND OF THE INVENTION

This invention relates to underfill encapsulant compounds prepared from epoxies to protect and reinforce the interconnections between an electronic component and a substrate in a microelectronic device. Microelectronic devices contain multiple types of electrical circuit components, mainly transistors assembled together in integrated circuit (IC) chips, but also resistors, capacitors, and other components. These electronic components are interconnected to form the circuits, and eventually are connected to and supported on a carrier or a substrate, such as a printed wire board. The integrated circuit component may comprise a single bare chip, a single encapsulated chip, or an encapsulated package of multiple chips. The single bare chip can be attached to a lead frame, which in turn is encapsulated and attached to the printed wire board, or it can be directly attached to the printed wire board. These chips are originally formed as a semiconductor wafer containing multiple chips. The semiconductor wafer is diced as desired into individual chips or chip packages.

Whether the component is a bare chip connected to a lead frame, or a package connected to a printed wire board or other substrate, the connections are made between electrical terminations on the electronic component and corresponding electrical terminations on the substrate. One method for making these connections uses polymeric or metallic material that is applied in bumps to the component or substrate terminals. The terminals are aligned and contacted together and the resulting assembly is heated to reflow the metallic or polymeric material and solidify the connection.

During its normal service life, the electronic assembly is subjected to cycles of widely varying temperature ranges. Due to the differences in the coefficient of thermal expansion for the electronic component, the interconnect material, and the substrate, this thermal cycling can stress the components of the assembly and cause it to fail. To prevent the failure, the gap between the component and the substrate is filled with a polymeric encapsulant, hereinafter called underfill or underfill encapsulant, to reinforce the interconnect material and to absorb some of the stress of the thermal cycling.

Two prominent uses for underfill technology are for reinforcing packages known in the industry as chip scale packages (CSP), in which a chip package is attached to a substrate, and flip-chip packages in which a chip is attached by an array of interconnections to a substrate.

In conventional capillary flow underfill applications, the underfill dispensing and curing takes place after the reflow of the metallic or polymeric interconnect. In this procedure, flux is initially applied on the metal pads on the substrate. Next, the chip is placed on the fluxed area of the substrate, on top of the soldering site. The assembly is then heated to allow for reflow of the solder joint. At this point, a measured amount of underfill encapsulant material is dispensed along one or more peripheral sides of the electronic assembly and capillary action within the component-to-substrate gap draws the material inward. After the gap is filled, additional underfill encapsulant may be dispensed along the complete assembly periphery to help reduce stress concentrations and prolong the fatigue life of the assembled structure. The underfill encapsulant is subsequently cured to reach its optimized final properties.

Recently, attempts have been made to streamline the process and increase efficiency by coating the underfill encapsulant directly on the semiconductor wafer before the wafer is diced into individual chips. The coating procedure, which can be performed via various methods, including screen printing, stencil printing and spin coating, allows for a single application of underfill to a single semiconductor wafer that is later diced into a large number of individual chips.

In order to be useful as a wafer level underfill encapsulant, the underfill must have several important properties. First, the material must be easy to apply uniformly on the wafer so that the entire wafer has a consistent coating. The underfill encapsulant that is applied to the wafer must not interfere with the clean dicing of the wafer into individual chips. The underfill encapsulant must be B-stageable, which means that the underfill must be solidified after its placement on a wafer to provide a smooth, non-tacky coating with minimal residual solvent.

If the starting underfill material is a solid, the solid is dispersed or dissolved in a solvent to form a paste and the paste applied to the wafer. The underfill is then heated to evaporate the solvent, leaving a solid, but uncured, underfill on the wafer. If the starting underfill material is a liquid or paste, the underfill is dispensed onto the wafer and heated to partially cure it to a solid state.

The B-stage process usually occurs at a temperature lower than about 150° C. without prematurely curing the underfill encapsulant. The final curing of the underfill encapsulant must be delayed until after the solder fluxing (in the situation that solder is the interconnect material) and interconnection, which occurs at a temperature of 183° C. in the case of tin/lead eutectic solder. The final curing of the underfill should occur rapidly after the solder bump flow and interconnection. During this final attachment of the individual chips to a substrate, the underfill encapsulant must flow in order to enable fillet formation, flux the solder bumps, and provide good adhesion between the chip, or chip passivation layer, the substrate, or the solder mask, and the solder joints. In particular instances, it can be useful to provide an unfilled liquid curable fluxing material directly on the substrate to faciliate interconnection.

SUMMARY OF THE INVENTION

The invention relates to a curable underfill encapsulant composition that is applied directly onto semiconductor wafers before the wafers are diced into individual chips. The composition comprises a thermally curable resin system comprising an epoxy resin, a solvent, an imidazole-anhydride catalyst, and optionally, fluxing agents. Various other additives, such as defoaming agents, wetting agents, adhesion promoters, flow additives and rheology modifiers may also be added as desired. The underfill encapsulant is B-stageable to provide a coating on the wafer that is smooth, non-tacky and will allow the wafer to be cleanly diced into individual chips. The individual chips are then attached directly to a substrate.

DETAILED DESCRIPTION OF THE INVENTION

The resins used in the underfill encapsulant composition of the present invention are curable compounds, which means that they are capable of polymerization. As used in this specification, to cure will mean to polymerize, with cross-linking. Cross-linking, as understood in the art, is the attachment of two-polymer chains by bridges of an element, a molecular group, or a compound, and in general takes place upon heating.

Ingredients of the B-stageable underfill encapsulant composition of the present invention include a blend of one or more epoxy resins, an imidazole-anhydride adduct which acts as a catalyst and one or more solvents. Optionally, fluxing agents, air release agents, flow additives, adhesion promoters, rheology modifiers, surfactants and other ingredients may be included. The ingredients are specifically chosen to obtain the desired balance of properties for the use of the particular resins. A solvent is chosen to dissolve the resin(s) and thus make the composition into a paste form with proper viscosity for application via spin coating, screen printing or stencil printing on the wafer. In the preferred embodiment, the composition is B-stageable, i.e., the composition is capable of an initial solidification that produces a, smooth, non-tacky coating on the semiconductor wafer. The B-stage solidification preferably occurs in at a temperature in the range of about 100° C. to about 150° C. After the B-stage process, a smooth, non-tacky solid coating is obtained on the wafer to ensure the clean dicing of the wafer into individual chips. The final, complete curing occurs at a second temperature that is higher than the B-stage curing temperature. Generally, the final cure of the composition occurs after the formation of the interconnections. In the case of Pb/Sn eutectic solder, the formation of the interconnections occurs at a temperature above the melting point of the solder, which is 183° C. A latent catalyst, the adduct of anhydride and imidazole, is used in the composition to ensure the proper cure of the composition without interfering with the formation of the interconnection. The catalyst chosen must prevent any curing, other than some minimal pre-curing, during the B-stage and must ensure that no gelation occurs on the non-tacky surface formed after the B-stage. Preferably, the B-stage solidification occurs at a temperature of at least 30° C. less than the final cure temperature. The catalyst must also allow for fluxing and curing in one reflow step. The underfill must first flux and then cure to ensure proper solder interconnect formation.

Examples of epoxy resins suitable for use in the present wafer level underfill composition include monofunctional and multifunctional glycidyl ethers of Bisphenol-A and Bisphenol-F, aliphatic and aromatic epoxies, saturated and unsaturated epoxies, or cycloaliphatic epoxy resins or a combination thereof. Examples of aliphatic epoxy include Flex Epoxy 1.

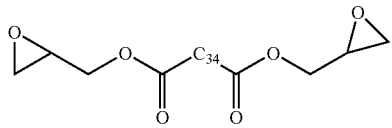

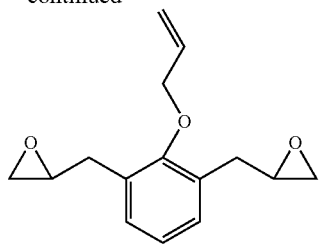

RAS-1

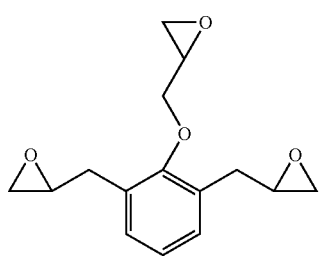

RAS-5

Example of aromatic epoxies include RAS-1, RAS-5 and Flex Epoxy3.

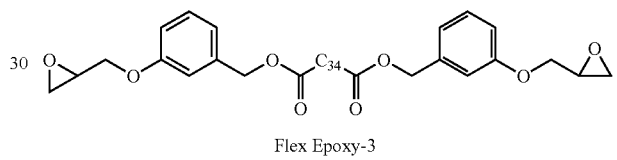

Flex Epoxy-3

Example of unsaturated epoxy includes Cardolite NC513.

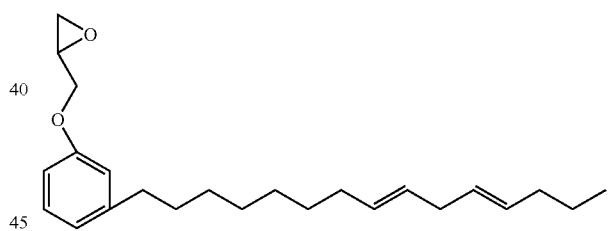

Cardolite NC513

Examples of non-glycidyl ether epoxides include 3,4-epoxycyclohexylmethyl-3,4-epoxycyclohexane carboxylate, which contains two epoxide groups that are part of the ring structures and an ester linkage, vinylcyclohexene dioxide, which contains two epoxide groups and one of which is part of the ring structure, 3,4-epoxy-6-methyl cyclohexyl methyl-3,4-epoxycyclohexane carboxylate and dicyclopentadiene dioxide.

Glycidyl ether epoxides are preferred in the invention, either separately or in combination with the non-glycidyl ether epoxides. A preferred epoxy resin of this type is bisphenol A resin. Another preferred epoxy resin is bisphenol F type resin. A preferred epoxy novolac resin is poly (phenyl glycidyl ether)-co-formaldehyde. Biphenyl type epoxy resin may also be utilized in the present invention. This type of resin is commonly prepared by the reaction of biphenyl resin and epichlorohydrin. Dicyclopentadiene-phenol epoxy resin, naphthalene resins, epoxy functional butadiene acrylonitrile copolymers, epoxy functional polydimethyl siloxane and mixtures thereof are additional types of epoxy resins which may be employed. Commercially available bisphenol-F type resins are available from CVC Specialty Chemicals, Maple Shade, N.J., under the designation 8230E and Resolution Performance Products LLC under the designation RSL1739. Bisphenol-A type resin is commercially available from Resolution Technology as EPON 828, EPON 1001, EPON 1002, and a blend of bisphenol-A and bisphenol-F is available from Nippon Chemical Company under the designation ZX-1059. A further epoxy that may be utilized is XP71756.00, which is commercially available from Vantico.

In addition to the resins, an imidazole-anhydride adduct is included in the underfill composition as a catalyst. The adduct provides different properties to the underfill than the properties provided by the inclusion of imidazole and anhydride as separate components. Preferred imidazoles that may be included in the adduct include non-N-substituted imidazoles such as 2-phenyl-4-methyl imidazole, 2-ethyl-4-methyl-imidazole, 2-phenyl imidazole and imidazole. Other useful imidazole components include alkyl-substituted imidazole, N-substituted imidazole and mixtures thereof. The adduct also comprises an anhydride component. The preferred anhydride is preferably a cycloaliphatic an hydride and most preferably pyromellitic dianhydride, commercially available as PMDA from Aldrich. Additional preferred anhydrides include methylhexa-hydro phthalic anhydride, commercially available as MHHPA from Lonza Inc. Intermediates and Actives. Other anhydrides that may be utilized include methyltetra-hydrophthalic anhydride, nadic methyl anhydride, hexa-hydro phthalic anhydride, tetra-hydro phthalic anhydride, phthalic anhydride, dodecyl succinic anhydride, bisphenyl dianhydride, benzophenone tetracarboxylic dianhydride, and mixtures thereof. A preferred catalyst is synthesized by combining 1 mole part 1,2,4,5-benzenetetracarboxylic dianhydride and 2 mole part 2-phenyl-4-methyimidazole. Both components are first dissolved in acetone under heat and when both are combined, the imidazole-dianhydride salt forms as a precipitate. This preferred catalyst, in combination with an epoxy and solvent, produces an underfill having an onset curing temperature well above 150° C. and a cure peak temperature above 183° C. Further, the preferred catalyst provides improved latency as opposed to the use of just an imidazole.

A fluxing agent may also be incorporated into the underfill composition. The fluxing agent primarily removes metal oxides and prevents reoxidation. While many different fluxing materials may be employed, the fluxing agent is preferably chosen from the group carboxylic acids. These carboxylic acids include rosin gum, dodecanedioic acid (commercially available as Corfree M2 from Aldrich), adipic acid, sebasic acid, polysebasic polyanhydride, maleic acid, tarrtaric acid, and citric acid. The flux agent may also be chosen from the group that includes alcohols, hydroxyl acid and hydroxyl base. Preferable fluxing materials include polyols such as ethylene glycol, glycerol, 3-[bis(glycidyl oxy methyl) methoxy]-1,2-propane diol, D-ribose, D-cellobiose, cellulose, 3-cyclohexene-1,1-dimethanol and similar materials. The strength of the acid is an important factor because the acid should be sufficiently strong to wash the oxides out of the solder and the substrate. Preferably, the $pK_a$ should be greater than 5. Stability of the acid at temperatures around 183° C. is important, and the acid should not decompose at temperatures lower than 183° C. As solder reflows at 183° C., a flux material that cannot withstand that temperature is unsuitable for the proper formulation.

A solvent is utilized to modify the viscosity of the composition. Preferably, the solvent will evaporate during the B-stage process which occurs at temperatures lower than about 150° C. Common solvents that readily dissolve the epoxy resins, are non-reactive and have the proper boiling point ranging from 100° C. to 200° C. are preferable for use with this application. Examples solvents that may be utilized include ketones, esters, alcohols, ethers, and other common solvents that are stable and dissolve the epoxy and phenolic resins in the composition. Preferred solvents include γ-butyrolactone and propylene glycol methyl ester acetate (PGMEA).

Additional ingredients may be added to the underfill encapsulant to produce a composition with the desired properties. For example, monofunctional reactive diluents can incrementally delay the increase in viscosity without adversely affecting the physical properties of the cured underfill. Preferred diluents include p-tert-butyl-phenyl glycidyl ether, allyl glycidyl ether, glycerol diblycidyl ether, glycidyl ether of alkyl phenol (commercially available from Cardolite Corporation as Cardolite NC513), and Butanediodiglycidylether (commercially available as BDGE from Aldrich), although other diluents may be utilized. Surfactants may be utilized to aid in the prevention of process voiding during the flip-chip bonding process and subsequent solder joint reflow and material curing. Various surfactants which may be utilized include organic acrylic polymers, silicones, polyoxyethylene/polyoxypropylene block copolymers, ethylene diamine based polyoxyethylene/polyoxypropylene block copolymers, polyol-based polyoxyalkylenes, fatty alcohol-based polyoxyalkylenes, fatty alcohol polyoxyalkylene alkyl ethers and mixtures thereof. In addition, coupling agents, air release agents, flow additives, adhesion promoters, inorganic fillers and other ingredients may also be added as desired.

A preferred embodiment of the underfill encapsulant of the present invention comprises at least one epoxy resin, an imidazole-anhydride adduct as a catalyst, a fluxing agent, solvent, and other ingredients as desired. The resin will comprise in the range of 20 wt % to about 90 wt % of the underfill composition. An imidazole-anhydride adduct is also added as a catalyst. The adduct comprises in the range of about 0.01 wt % to about 10 wt % of the underfill composition and preferably about 0.1 wt % to about 5 wt % of the composition. Optionally, a fluxing agent is added comprising in the range of about 0.5 wt % to about 20 wt % of the composition and preferably in the range of about 1 wt % to about 10 wt % of the composition. In addition, up to 80 wt % of solvent(s) may be added. Finally, optional ingredients such as surfactants, air release agents, flow additives, rheology modifiers, inorganic fillers and adhesion promoters may be added to the composition in the range of about 0.01 wt % to about 5 wt % of the composition.

To utilize the B-stageable underfill composition, it is first applied directly onto a semiconductor wafer or individual chip via screen printing, spin coating or stencil printing. The wafer or chip having the coating is heated to an initial, B-stage temperature in the range of about 100° C. to about 140° C. for about 10 minutes to one hour so that the composition is B-stage solidified in the form of a smooth, non-tacky and void-free film. In the case of a wafer, the wafer is diced into individual chips. The chips having the B-staged composition are placed on a substrate with the B-staged composition adjacent to the substrate and the entire assembly is heated to a temperature of approximately 183° C. (in the case that lead/tin solder is utilized). This second heating causes the formation of interconnections between the substrate and the chip and the fluxing of the solder balls on the chip.

In an alternative embodiment, a composition comprising an unfilled liquid curable fluxing material comprising an epoxy resin, a phenolic-containing compound and an imidazole/anhydride adduct is applied directly to the substrate prior to placement of the chip. After the underfill is B-stage solidified on the wafer and the wafer is diced into individual chips, the chip is placed on the substrate with the B-staged material adjacent to and in contact with the unfilled liquid curable material. The unfilled liquid curable material facilitates improved solder fluxing and interconnections between the substrate and the individual chips. When the composition of the alternative embodiment is placed on a substrate and a chip having the B-stageable composition is placed on the substrate, a superior interconnect is formed after the completion of the reflow process.

The invention may be better understood by reference to the following examples:

EXAMPLE 1

Five underfill encapsulant compositions were formulated as set out in Table 1. To make each formulation, the epoxy was first dissolved into the solvent under heat. When clean rosin was used as the fluxing agent, as in formulation 1, it was added during this first step and heated until a homogenous epoxy-solvent-rosin mixture formed. The rosin that is added must first be treated to form a clean-rosin gum. The treatment consists of heating the commercial rosin in a vacuum oven to drive off any impurities to form a "clean" fluxing reagent. On the other hand, if Corfree M2 is used as the fluxing reagent, as in formulations 2–5, it is added only after the epoxy-solvent mixture has cooled to room temperature. The rest of the components (catalyst, wetting agent, and defoamer) are also added after the epoxy-solvent or epoxy-solvent-rosin material has cooled to room temperature. The material is then mixed thoroughly and vacuumed under room temperature to degas the underfill.

TABLE 1

Underfill Formulations

| No. | Epoxy Resin[1] | Solvent[2] | Fluxing Agent[3] | Catalyst[4] | Wetting Agent[5] | Defoamer[6] |
| --- | --- | --- | --- | --- | --- | --- |
| 1 | 57.00 | 40.00 | 2.85 | 0.29 | 0.29 | 0.29 |
| 2 | 55.04 | 38.63 | 5.50 | 0.28 | 0.27 | 0.28 |
| 3 | 57.00 | 40.00 | 5.7 | 0.29 | 0.29 | 0.29 |
| 4 | 70.70 | 29.60 | 7.07 | 0.35 | 0.71 | 0.71 |
| 5 | 70.70 | 29.60 | 7.07 | 0.35 | 0.71 | 0.71 |

[1] EPON 1001 from Resolution Products for samples 1–3, and XP 71756, also known as Tactix556, from Vantico for samples 4–5
[2] Solvent BLO (γ-butyrolactone) for samples 1–4 and PGMEA (propylene glycol methyl ether acetate) for sample 5, both from Aldrich Chemical
[3] Fluxing Agent clean rosin for sample 1 (vacuumed under heat to rid of impurities); Corfree M2 for sample 2–5
[4] Catalyst is imidazole-anhydride adduct
[5] Wetting Agent is G6715, 3-glycidoxypropylpentamethyl disiloxane from United Technologies
[6] Defoamer BYK A500 (Chemie) for sample 1, phthalo blue (Plasticolors) for sample 2, and Agitan 731 (Ultra Additives) for samples 3–5.

The viscosities of the five formulations are listed in Table 2. The viscosities were measured using an Advanced Rheology Expansion System, made by Rheometric Scientific, with 25-mm parallel plates, at 1% strain, a steady pre-shear rate of 1s$^{-1}$, and from the range of 1–100rad/s at room temperature.

TABLE 2

Viscosities of Underfill Formulations

| Formulation | Viscosity (cP) |
| --- | --- |
| 1 | 5,550 |
| 2 | 3,350 |
| 3 | 4,600 |
| 4 | 4,360 |
| 5 | 12,070 |

The viscosities of the samples are all within the ranges necessary to screen and stencil print.

EXAMPLE 2

In order to find the proper B-staging conditions, two criteria are desired. These criteria are that, after the B-stage, the material must be non-tacky and not cured. To test whether these criteria were met, eight glass slides were bumped with 20-mil solder balls. About 20 mil of formulation 1 listed in Table 1 was then stenciled onto the glass slides. Each slide was then placed into a 130° C. oven. Each slide was then B-staged for different times in the oven (30, 40, 50, 60, 70, 80, 90, or 100 minutes). After each slide had cooled, a wooden stick was placed atop the film to evaluate tackiness. If the wooden stick left a mark on the film, it was deemed tacky. If the wooden stick left no mark, it was considered non-tacky. To perform the cure test, each slide was placed through the eutectic solder reflow oven. After the slides had gone through the reflow profile, each slide was examined to determine if the solder had melted. When the solder melted, the curing time was considered as non-curable B-staging time: time left in the oven did not start the overall curing process. However, when the solder did not melt, the B-staging time was considered too long and already cured the underfill. The results are shown in Table 3.

TABLE 3

B-staged Properties of Underfill

| Time (Minutes at 130° C.) | Tacky | Cured |
| --- | --- | --- |
| 30 | Y | N |
| 40 | Y | N |
| 50 | N | N |
| 60 | N | N |
| 70 | N | Y |
| 80 | N | Y |
| 90 | N | Y |
| 100 | N | Y |

As shown in Table 3, when the underfill is B-staged for less than an optimal time the resulting film remained tacky to the touch. When the underfill is B-staged for longer than an optimal time, curing of the film is initiated and that has a detrimental affect on the attachment process. At 130° C. the optimal curing time is about 50–60 minutes. As the underfill's curing onset temperature is about 150° C., temperatures above 130° C. are rarely utilized for B-staging. Temperatures below 130° C. may be utilized, but the time required to reach the proper B-stage state are longer the lower the temperature.

EXAMPLE 3

The proper Tg for B-staged underfill is critical. Diamond saws, as used for dicing wafers, can cleanly cut through materials having a Tg within the range of about 50–95° C. If the Tg is much higher than the target range, cracks can occur and break the B-staged underfill off the wafer. If the Tg is below 50° C., the film may become sticky during the dicing and stick to the diamond saw. Several formulations were made with low Tg and the observations are shown in Table 4. The temperature was ramped up at a rate of 5° C./min and the Tgs of each sample were measured by a TA Instruments thermomechanical analyzer using the TA analysis program. Formulation A and B are made similarly to the formulations in Table 1. Low Tg resins were used in these formulations (Formulation A consists of a mixture of EPON1001 and maleimides. Formulation B consists of EPON1001 and glycidal methacrylate). Table 4 also illustrates the Tg of the five samples of Table 1. The Tgs of these five samples fall within the diceable range (50–90° C.) and have shown to be diceable.

TABLE 4

Dicing Properties of Underfills

| Formulation | Tg (° C.) | Dicing Observations |
|---|---|---|
| A | 21 | Sticks to saw |
| B | 48 | Sticks to saw |
| 1 | 62–64 | Cleanly diced |
| 2 | 79–84 | Cleanly diced |
| 3 | 58–60 | Cleanly diced |
| 4 | 87–94 | Cleanly diced |
| 5 | 74–80 | Cleanly diced |

EXAMPLE 4

The viscosites of several different epoxy resin/fluxing agent mixtures were measured. Mixtures Z, Y, X, W, and V were each made by mixing 90 wt % epoxy resin (Z=EPON 1001, Y=EPON 1002, X=EPON 1004, W=EPON 1007, and V=EPON 1009) and 10% of fluxing agents PSPA (polysebaeic polyanhydride) together. Three solder balls, each having a 20-mil diameter, were placed on five separate copper substrates. One of the mixtures was printed on top of the solder balls on each substrate. Each printed substrates was then heated to 150° C. for 2 minutes followed immediately by 190° C. for 1 minute. Observations of the solder are shown in Table 5. Also in Table 5, the viscosities of each mixture are reported. Using the single point analysis of Rheometric Scientific Instrument at 100 rad/s frequency, 5% strain temperature of 190° C., and 50 mm parallel plates were used to determine each of the viscosities.

TABLE 5

Solder Flux Observations

| Sample | Viscosity at 190° C. (cP) | Solder Flux Observation |
|---|---|---|
| Z | 874 | Complete Fluxing |
| Y | 2,905 | Complete Fluxing |
| X | 5,951 | Partial Fluxing |
| W | 16,615 | No Fluxing |
| V | 351,141 | No Fluxing |

As shown in Table 5, resins with a viscosity of about 5,900 cP or lower are preferable to accommodate the fluxing capability.

The degree to which fluxing occurs is measurable by the change in the radius of the solder balls. The radii of the solder balls containing various fluxing agents were measured and the results are shown in Table 6.

TABLE 6

Fluxing Agents

| Acid | PKa | Radius of Solder (mil) |
|---|---|---|
| Citric | 3.14 | 35.68 |
| Corfree M2 | 4.59 | 31.67 |
| L-cysteine | 7.85 | 10.00 |
| Resorcinol | 9.87 | 10.00 |
| Hydroquinone | 10.35 | 10.00 |

As shown in Table 6, citric acid and Corfree M2 were preferable among the fluxing agents that were tested. The flux capability of the formulations listed in Table 1 was tested using the method as described above. All the formulations in Table 1 show the enlargement of the solder ball in radius.

We claim:

1. A B-stageable underfill encapsulant, wherein the encapsulant solidifies at a first temperature during the B-stage process to produce a smooth, non-tacky surface on a semiconductor wafer or silicon chip and wherein substantially the entire encapsulant cures at a second temperature that is higher than the first temperature, wherein the encapsulant comprises:

a) a thermal curable resin;

b) an imidazole-anhydride adduct;

c) at least one solvent;

d) one or more fluxing agents; and e) optionally, one or more of the group consisting of surfactants, wetting agents, defoaming agents, coupling agents, inorganic fillers, adhesion promoters, flow additives, air release agents, and mixtures thereof, wherein the imidazole-anhydride adduct comprises an adduct of 2-phenyl-4-methyl imidazole and pyromellitic dianhydride.

2. The encapsulant of claim 1, wherein the thermal curable resin is selected from the group consisting of monofunctional and multifunctional glycidyl ethers of Bisphenol-A, monofunctional and multifunctional glycidyl ethers of Bisphenol-F, aliphatic epoxies, aromatic epoxies, saturated epoxies, unsaturated epoxies, cycloaliphatic epoxy resins, epoxies having the structures

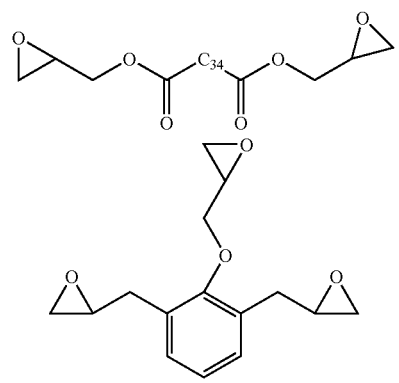

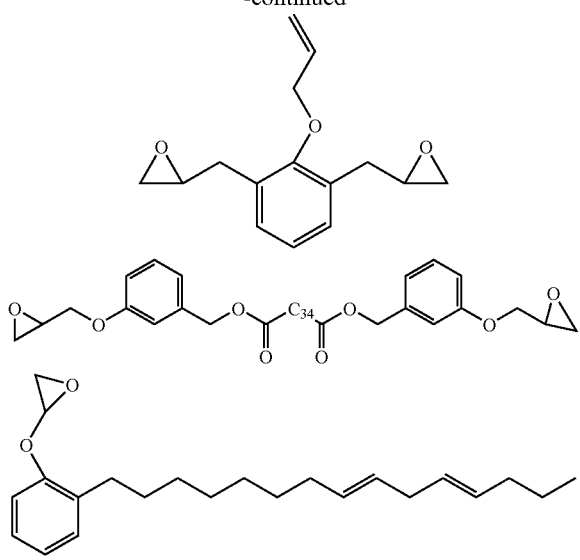

or mixtures thereof.

3. The encapsulant of claim 2, wherein the thermal curable resin is selected from the group consisting of 3,4-epoxycyclohexylmethyl-3,4-epoxycyclohexane carboxylate, vinylcyclohexene dioxide, 3,4-epoxy-6-methyl cyclohexyl methyl-3,4-epoxycyclohexane carboxylate, dicyclopentadine dioxide, bisphenol A epoxy resin, bisphenol F epoxy resin, epoxy novolac resin, poly(phenyl glycidyl ether)-co-formaldehyde, biphenyl type epoxy resin, dicyclopentadiene-phenol epoxy resins, naphthalene epoxy resins, epoxy functional butadiene acrylonitrile copolymers, epoxy functional polydimethyl siloxane, and mixtures thereof.

4. The encapsulant of claim 3, wherein the thermal curable resin comprises in the range of about 20 wt % to about 90 wt % of the encapsulant.

5. The encapsulant of claim 4, wherein the thermal curable resin comprises in the range of about 20 wt % to about 80 wt % of the encapsulant.

6. The encapsulant of claim 1, wherein the imidazole-anhydride adduct is synthesized by combining 1 mole part 1,2,4,5-benzenetetracarboxylic dianhydride and 2 mole part 2-phenyl-4-methylimidazole.

7. The encapsulant of claim 1, wherein the imidazole-anhydride adduct comprises in the range of about 0.01 wt % to about 10 wt % of the encapsulant.

8. The encapsulant of claim 7, wherein the imidazole-anhydride adduct comprises in the range of about 0.1 wt % to about 5 wt % of the encapsulant.

9. The encapsulant of claim 1, wherein the at least one solvent is selected from the group comprising solvents that are stable and dissolve the epoxy resins in the composition.

10. The encapsulant of claim 9, wherein the at least one solvent is selected from the group consisting of ketones, esters, alcohols, ethers, γ-butyrolactone and propylene glycol methyl ether acetate (PGMEA) and mixtures thereof.

11. The encapsulant of claim 10, wherein the at least one solvent is selected from the group consisting of γ-butyrolactone, propylene glycol methyl ether acetate (PGMEA) and mixtures thereof.

12. The encapsulant of claim 9, wherein the solvent comprises up to about 80 wt % of the encapsulant.

13. The encapsulant of claim 1 wherein the at least one fluxing agent is selected from the group consisting of carboxylic acids, rosin gum, dodecanedioic acid, adipic acid, sebasic acid, polysebasic polyanhydride, maleic acid, tartaric acid, citric acid, alcohols, hydroxyl acid and hydroxyl base, polyols, ethylene glycol, glycerol, 3-[bis(glycidyl oxy methyl) methoxy]-1,2-propane diol, D-ribose, D-cellobiose, cellulose, 3-cyclohexene-1,1-dimethanol, and mixtures thereof.

14. The encapsulant of claim 13, wherein the at least one flux agent comprises rosin gum, dodecanedioic acid, adipic acid, or mixtures thereof.

15. The encapsulant of claim 14, wherein the at least one flux agent comprises in the range of about 0.5 wt % to about 20 wt % of the encapsulant.

16. The encapsulant of claim 15, wherein the at least one flux agent comprises in the range of about 1 wt % to about 10 wt % of the encapsulant.

17. The encapsulant of claim 1, wherein the encapsulant further comprises one or more of group consisting of surfactants, wetting agents, defoaming agents, coupling agents, inorganic fillers, adhesion promoters, flow additives, air release agents and mixtures thereof.

18. The encapsulant of claim 17, wherein the surfactant is selected from the group consisting of organic acrylic polymers, silicones, epoxy-silicones, polyoxyethylene/polyoxypropylene block copolymers, ethylene diamine based polyoxyethylene/polyoxpropylene block copolymers, polyol-based polyoxyalkylenes, fatty alcohol-based polyoxyalkylenes, fatty alcohol polyoxyalkylene alkyl ethers and mixtures thereof.

19. A method of preparing one or more silicon chips, comprising the steps of
   a) applying the encapsulant of claim 1 to a semiconductor wafer;
   b) B-stage processing the encapsulant on the semiconductor wafer so that the encapsulant solidifies into a smooth, non-tacky coating; and
   c) dicing the semiconductor wafer into individual silicon chips.

20. The method of claim 19, wherein the encapsulant is applied to the semiconductor wafer via spin coating, screen printing or stencil printing.

21. A method of preparing an electronic package comprising the steps of
   a) applying the encapsulant of claim 1 to a semiconductor wafer;
   b) B-stage processing the encapsulant on the semiconductor wafer so that the encapsulant solidifies into a smooth, non-tacky coating;
   c) dicing the semiconductor wafer into multiple silicon chips, with each chip having a first side coated with the encapsulant;
   d) placing one or more silicon chips on a substrate so that the first side of the silicon chip is adjacent to the substrate; and
   e) heating the one or more silicon chips and substrate to a temperature sufficient to form interconnections between the one or more silicon chips and the substrate.

22. The method of claim 21, comprising the additional step of placing an unfilled liquid curable fluxing material on the substrate before the silicon chip is placed on the substrate.

23. The method of claim 22, wherein the unfilled liquid curable fluxing material comprises
   a) a thermal curable epoxy resin;
   b) an imidazole-anhydride adduct; and
   c) at least one fluxing agent, wherein the imidazole-anhydride adduct comprises an adduct of 2-phenyl-4-methyl imidazole and pyromellitic dianhydride.

24. A silicon wafer having a B-stageable underfill composition that is curable at a single temperature deposited on one face of the wafer, the B-stageable composition comprising
   a) a thermal curable resin;
   b) an imidazole-anhydride adduct;
   c) at least one solvent;
   d) one or more fluxing agents; and
   e) optionally, one or more additive selected from the group consisting of surfactants, wetting agents, defoaming agents, coupling agents, inorganic fillers, adhesion promoters, flow additives, air release agents, and mixtures thereof, wherein the imidazole-anhydride adduct comprises an adduct of 2-phenyl-4methyl imidazole and pyromellitic dianhydride.

* * * * *